(12) United States Patent
Park et al.

(10) Patent No.: US 10,642,399 B2
(45) Date of Patent: *May 5, 2020

(54) DISPLAY DEVICE

(71) Applicant: Samsung Display Co., Ltd., Yongin-si (KR)

(72) Inventors: Yong-Hwan Park, Cheonan-si (KR); Jong Seok Kim, Yongin-si (KR); Chi Wook An, Hwaseong-si (KR); Seong Jun Lee, Suwon-si (KR); Sang Hyun Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/562,945

(22) Filed: Sep. 6, 2019

(65) Prior Publication Data

US 2020/0012373 A1    Jan. 9, 2020

Related U.S. Application Data (63) Continuation of application No. 16/015,386, filed on Jun. 22, 2018, now Pat. No. 10,409,410, which is a
(Continued)

(30) Foreign Application Priority Data

Oct. 10, 2014    (KR) .......................... 10-2014-0136987

(51) Int. Cl.
  *G06F 3/041*  (2006.01)
  *G06F 3/044*  (2006.01)
  *H01L 27/32*  (2006.01)

(52) U.S. Cl.
  CPC ............ *G06F 3/0412* (2013.01); *G06F 3/044* (2013.01); *G06F 3/0416* (2013.01);
(Continued)

(58) Field of Classification Search
  None
  See application file for complete search history.

(56) References Cited

U.S. PATENT DOCUMENTS 9,054,327 B2  6/2015  Kim et al.
9,323,400 B2  4/2016  Kim et al.
(Continued)

FOREIGN PATENT DOCUMENTS

KR    10-2012-0060926    6/2012

OTHER PUBLICATIONS

Non-Final Office Action dated Mar. 10, 2017, in U.S. Appl. No. 14/725,852.
(Continued)

*Primary Examiner* — Christopher J Kohlman
(74) *Attorney, Agent, or Firm* — H.C. Park & Asociates, PLC (57) ABSTRACT

A display device is disclosed. In one aspect, the display device includes a substrate including a display area and a non-display area adjacent to the display area and a display member formed over the substrate in the display area. The display device also includes an encapsulation layer formed over the display member and encapsulating the display member together with the substrate and a plurality of first touch lines formed over the encapsulation layer in the display area. The first touch lines extend in a first direction. The display device further includes a plurality of second touch lines formed on the same layer as the first touch lines in the display area. The second touch lines extend in the first direction and are spaced apart from the first touch lines.

20 Claims, 4 Drawing Sheets

Related U.S. Application Data continuation of application No. 14/725,852, filed on May 29, 2015, now Pat. No. 10,007,370.

(52) U.S. Cl.
CPC .. *H01L 27/323* (2013.01); *G06F 2203/04103* (2013.01); *G06F 2203/04111* (2013.01)

(56) References Cited

U.S. PATENT DOCUMENTS

| | | |
|---|---|---|
| 2010/0328208 A1 | 12/2010 | Austin et al. |
| 2011/0073864 A1 | 3/2011 | Liu et al. |
| 2012/0227259 A1* | 9/2012 | Badaye .................. G06F 3/044 29/846 |
| 2013/0021289 A1* | 1/2013 | Chen ..................... G06F 1/1601 345/174 |
| 2013/0120231 A1* | 5/2013 | Jo ....................... G02F 1/13452 345/98 |
| 2014/0313164 A1 | 10/2014 | Pi |

OTHER PUBLICATIONS

Non-Final Office Action dated Oct. 5, 2017, in U.S. Appl. No. 14/725,852.
Notice of Allowance dated Feb. 26, 2018, in U.S. Appl. No. 14/725,852.
Notice of Allowance dated Apr. 29, 2019, in U.S. Appl. No. 16/015,386.
Notice of Allowance dated Jan. 14, 2019, in U.S. Appl. No. 16/015,386.
Non-Final Office Action dated Aug. 8, 2018, in U.S. Appl. No. 16/015,386.

* cited by examiner

DISPLAY DEVICE

CROSS-REFERENCE TO RELATED APPLICATIONS

This application is a Continuation of U.S. patent application Ser. No. 16/015,386, filed Jun. 22, 2018, which issued as U.S. Pat. No. 10,409,410, which is a Continuation of U.S. patent application Ser. No. 14/725,852, filed May 29, 2015, which issued as U.S. Pat. No. 10,007,370, and claims priority to from and the benefit of Korean Patent Application No. 10-2014-0136987, filed Oct. 10, 2014, each of which is hereby incorporated by reference for all purposes as if fully set forth herein.

BACKGROUND

Field

The described technology generally relates to a display device.

Description of the Related Technology

A touch sensor can sense touch input received from a pen or a finger of a user.

Recently, display devices such as organic light-emitting diode (OLED) displays, liquid crystal displays (LCDs), or the like, have included touch sensors formed directly thereon in order to decrease the manufacturing cost and reduce the display's profile.

One common type of touch sensor is a capacitive touch sensor which can sense touch input position by detecting a change in a capacitance of the touch sensor at a position corresponding to the position of the touch input.

Traditional capacitive touch sensors as described above include a plurality of touch lines insulated from and intersecting each other in order to sense changes in capacitance.

The above information disclosed in this Background section is only intended to facilitate the understanding of the background of the described technology and therefore it may contain information that does not form the prior art that is already known in this country to a person of ordinary skill in the art.

SUMMARY OF CERTAIN INVENTIVE ASPECTS

One inventive aspect is a display device including a touch member reduced manufacturing time and manufacturing cost.

Another aspect is a display device including a substrate including a display area and a non-display area neighboring the display area; a display member positioned on the display area of the substrate and displaying an image; an encapsulation positioned above the substrate with the display member interposed therebetween and encapsulating the display member together with the substrate; first touch lines positioned on the encapsulation so as to correspond to the display area and extended in a first direction; and second touch lines positioned on the same layer as a layer on which the first touch lines are positioned, on the encapsulation so as to correspond to the display area, and extended in the first direction in a state in which they are spaced apart from the first touch lines.

Each of the first touch lines and the second touch lines may be formed on a surface of the encapsulation.

End portions of the first touch lines and end portions of second touch lines corresponding to the display area may be bent and extended once or more and neighbor to each other.

The number of first touch lines may be plural and the first touch lines may be arranged in a second direction intersecting the first direction in a state in which they are spaced apart from each other.

The number of second touch lines may be plural and the second touch lines may be arranged in the second direction between the first touch lines neighboring thereto in a state in which they are spaced apart from each other.

The second touch lines may include: main lines extended in the first direction and a plurality of branch lines extended from the main lines and neighboring to the first touch lines, respectively.

The display device may further include bridge lines positioned between the substrate and the encapsulation so as to correspond to the non-display area and extended in a second direction intersecting the first direction to thereby be connected to the first touch lines.

The display member may include: an organic light-emitting diode (OLED) emitting light and a thin film transistor connected to the OLED.

The bridge lines may be positioned on the same layer as a layer on which a gate electrode of the thin film transistor is positioned to include the same material as that of the gate electrode.

The bridge lines may be positioned on the same layer as a layer on which source and drain electrodes of the thin film transistor are positioned to include the same material as those of the source and drain electrodes.

The second touch lines may be insulated from and intersect the bridge lines in the non-display area.

The encapsulation may include first bridge contact holes exposing the bridge lines and the first touch lines may be connected to the bridge lines through the first bridge contact holes.

The encapsulation may further include second bridge contact holes exposing the bridge lines and connection lines may be connected to the bridge lines through the second bridge contact hole.

The connection lines may include the same material as that of the first touch lines.

The connection lines may be extended together with the second touch lines toward an end portion of the substrate.

The number of bridge lines may be plural and the bridge lines may be arranged in the first direction in a state in which they are spaced apart from each other.

The number of first touch lines may be plural, and a plurality of first touch lines selected among the first touch lines may be connected to one bridge line selected among the bridge lines.

The number of connection lines may be plural and the connection lines may be each connected to different bridge lines to which the first touch lines are connected.

The encapsulation may include at least one organic layer and at least one inorganic layer that are alternately stacked.

An upper inorganic layer stacked at an area wider than those of other layers may be positioned on the uppermost layer of the encapsulation so as to cover end portions of other layers and the organic layer may not overlap the bridge lines between the bridge lines and the upper inorganic layer.

Another aspect is a display device comprising a substrate including a display area and a non-display area adjacent to the display area; a display member formed over the substrate in the display area; an encapsulation layer formed over the display member and encapsulating the display member together with the substrate; a plurality of first touch lines formed over the encapsulation layer in the display area, wherein the first touch lines extend in a first direction; and a plurality of second touch lines formed on the same layer as the first touch lines in the display area, wherein the second touch lines extend in the first direction and are spaced apart from the first touch lines.

In exemplary embodiments, each of the first touch lines and the second touch lines is formed directly on a surface of the encapsulation layer. End portions of each of the first and second touch lines formed in the display area can be bent and extend so as to neighbor to each other. The first touch lines can be arranged in a second direction crossing the first direction and can be spaced apart from each other. The second touch lines can be: i) arranged in the second direction, ii) interposed between the first touch lines and iii) spaced apart from each other. Each of the second touch lines can include a main line extending in the first direction and a plurality of branch lines extending from the main line and respectively neighboring the first touch lines.

In exemplary embodiments, the display device further comprises a plurality of bridge lines positioned between the substrate and the encapsulation layer in the non-display area, wherein the bridge lines extend in a second direction crossing the first direction and are electrically connected to the first touch lines. The display member can include a plurality of organic light-emitting diodes (OLEDs) and a plurality of thin film transistors respectively electrically connected to the OLEDs. Each of the thin film transistors can comprise a gate electrode and the bridge lines can be formed on the same layer the gate electrodes and are formed of the same material as that of the gate electrodes.

In exemplary embodiments, each of the thin film transistors comprises source and drain electrodes and wherein the bridge lines are formed on the same layer as the source and drain electrodes and are formed of the same material as that of the source and drain electrodes. The second touch lines can be electrically insulated from and cross the bridge lines in the non-display area. The encapsulation layer can include a plurality of first bridge contact holes over the bridge lines and the first touch lines can be electrically connected to the bridge lines via the first bridge contact holes. The encapsulation layer can further include a plurality of second bridge contact holes over the bridge lines and the display device can further comprise a plurality of connection lines electrically connected to the bridge lines via the second bridge contact holes.

In exemplary embodiments, the connection lines include the same material as that of the first touch lines. The connection lines can extend together with the second touch lines toward an end portion of the substrate. The bridge lines can be arranged in the first direction and can be spaced apart from each other. A subset of the first touch lines can be electrically connected to one of the bridge lines. The connection lines can be respectively connected to the bridge lines to which the first touch lines are connected. The encapsulation layer can include at least one organic layer and at least one inorganic layer that are alternately stacked. The encapsulation layer can comprise an upper inorganic layer formed over a wider area than remaining layers of the encapsulation layer and positioned over the remaining layers of the encapsulation layer so as to cover end portions of the remaining layers and the organic layer does not overlap the bridge lines.

As set forth above, according to exemplary embodiments, a display device including a touch member can have a reduced manufacturing time and manufacturing cost.

DETAILED DESCRIPTION OF CERTAIN INVENTIVE EMBODIMENTS

Hereinafter, several exemplary embodiments of the described technology will be described in detail with reference to the accompanying drawings so that those skilled in the art to which the described technology pertains may easily practice the described technology. However, the described technology may be implemented in various different forms and is not limited to exemplary embodiments provided herein.

Portions unrelated to the description will be omitted in order to more clearly describe the described technology and similar components will be denoted by the same reference numerals throughout the specification.

In addition, in several exemplary embodiments, components having the same configuration will be representatively described using the same reference numerals in an exemplary embodiment and only components different from those of the exemplary embodiment will be described in the other exemplary embodiments.

In addition, since the sizes and thicknesses of the respective components shown in the accompanying drawings may be exaggerated for the sake of clarity, the described technology is not necessarily limited to contents shown in the accompanying drawings.

In the accompanying drawings, the thickness of layers, films, panels, regions, etc., may be exaggerated for the sake of clarity. It will be understood that when an element such as a layer, a film, a region, or a substrate is referred to as being "on" another element, it may be directly on another element or there may also be an intervening element present therebetween.

In addition, throughout the present specification, unless explicitly described to the contrary, the word "comprise" and variations such as "comprises" or "comprising", will be understood to imply the inclusion of stated elements but not the exclusion of any other elements. In addition, throughout the specification, the word "on" does not necessarily mean that any element is positioned at an upper side based on the direction of gravity, but only refers to the relative positioning of the described element as illustrated in the drawings which may not necessarily reflect the relative position of the element when the orientation of the device is altered.

Hereinafter, a display device according to an exemplary embodiment will be described with reference to FIGS. 1 to 3. Hereinafter, although an OLED display including an OLED will be described as an example of a display device, a display device according to another exemplary embodiment may be one of various types of display devices such as LCDs, plasma displays (PDs), field emission displays (FEDs), electrophoretic displays, (EPDs), electrowetting displays, (EWDs), and the like, as long as it includes a display member that can display an image and a touch member or touch sensor that can sense a touch input.

Figure 1:
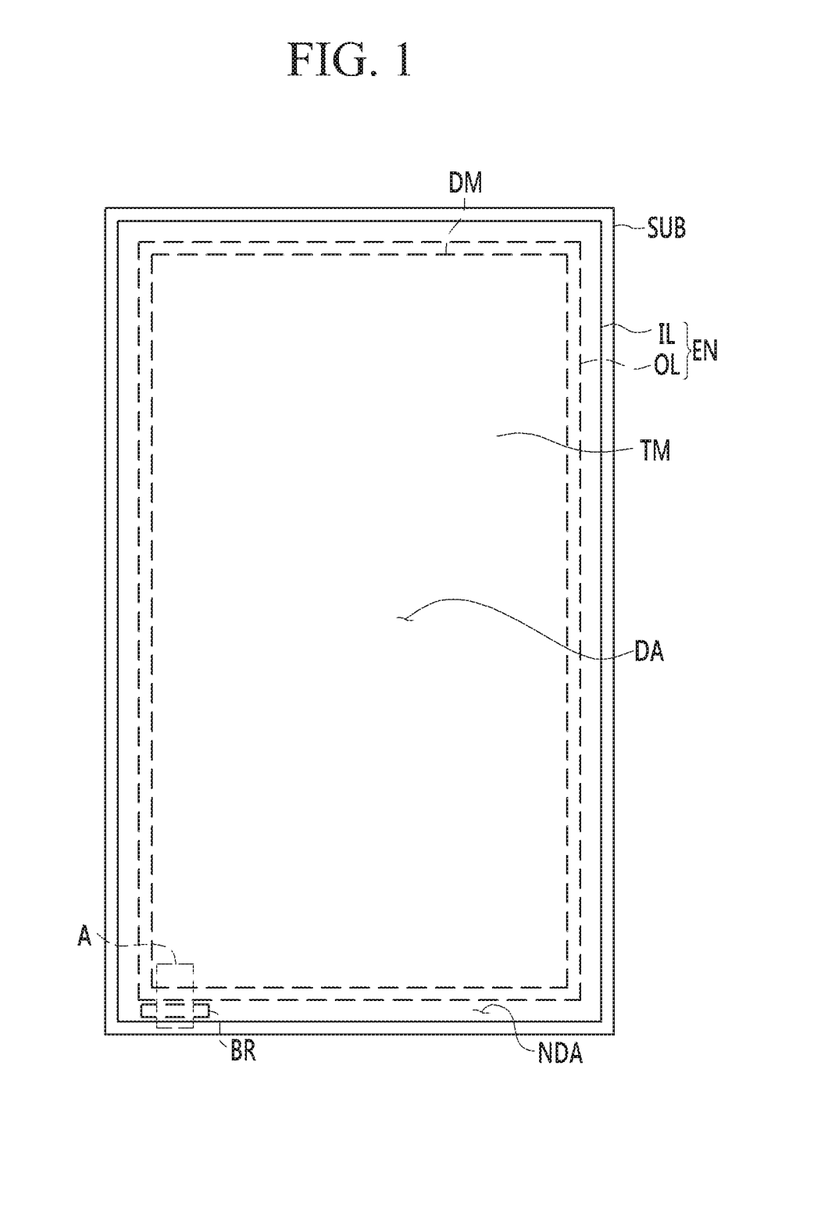
FIG. 1 is a plan view of a display device according to an exemplary embodiment.

FIG. 1 is a plan view of a display device according to an exemplary embodiment. FIG. 2 is an enlarged view of portion A of FIG. 1. FIG. 3 is a cross-sectional view taken along line III-III of FIG. 2.

Figure 2:
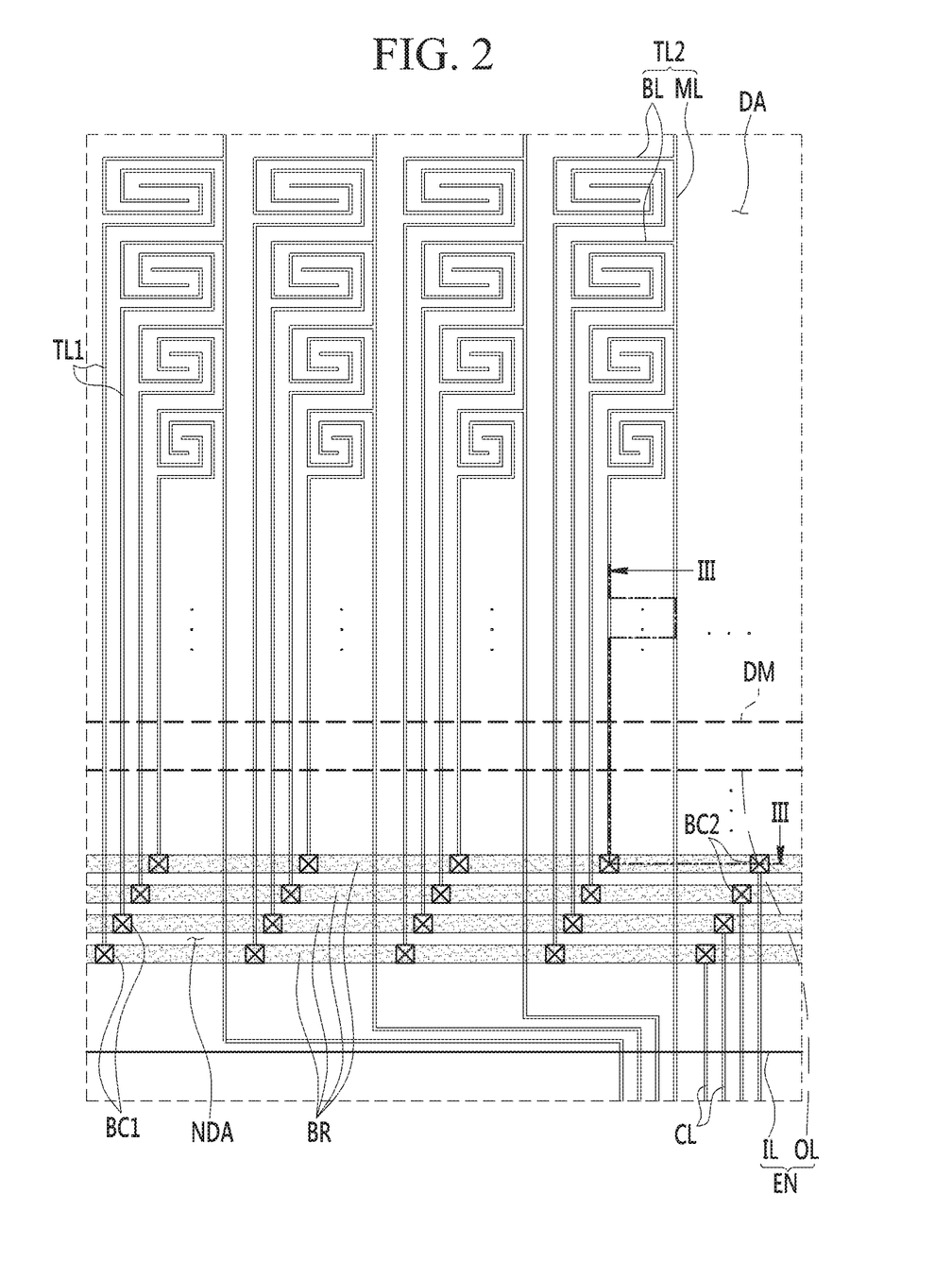
FIG. 2 is an enlarged view of portion A of FIG. 1.
Figure 3:
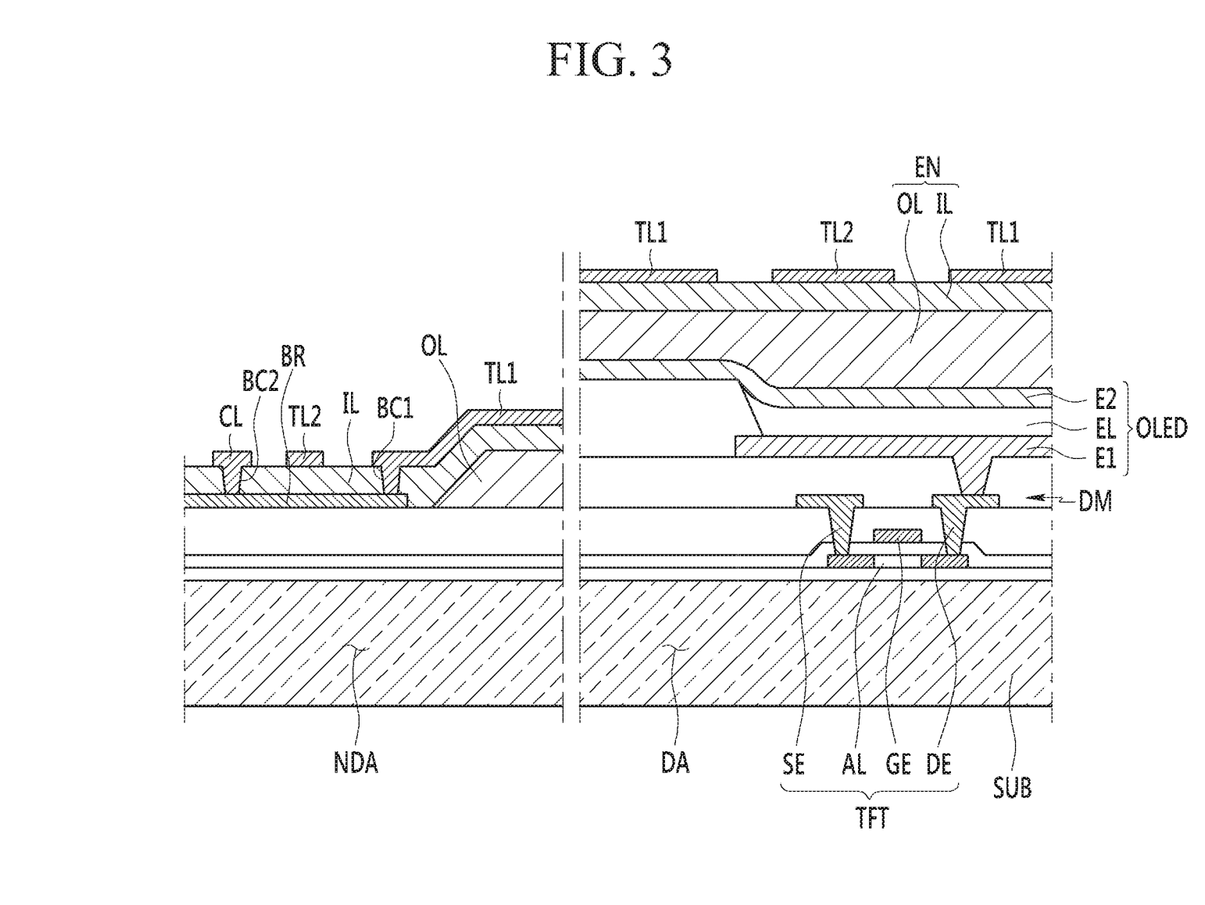
FIG. 3 is a cross-sectional view taken along line III-III of FIG. 2.

As shown in FIGS. 1 to 3, a display device according to an exemplary embodiment includes a substrate SUB, a display member DM, an encapsulation or encapsulation layer EN, a touch member or touch sensor TM, and bridge lines BR.

The substrate SUB is an electrically insulating substrate which may be formed of glass, polymer, stainless steel, or the like. The substrate SUB may be flexible, stretchable, foldable, bendable, and/or rollable. When the substrate SUB is flexible, stretchable, foldable, bendable, and/or rollable, the entire OLED display may be flexible, stretchable, foldable, bendable, and/or rollable. For example, the substrate SUB may be a flexible film including a resin such as polyimide, or the like.

The substrate SUB includes a display area DA in which the display member DM that can display an image is positioned and a non-display area NDA adjacent to the display area DA and in which the bridge lines BR are positioned. In some embodiments, the non-display area NDA surrounds the display area DA or is adjacent to one end portion of the display area DA.

The display member DM is positioned on the display area DA of the substrate SUB and displays the image via a plurality of pixels. Here, the term pixel generally refers a minimum unit for displaying the image. The display member DM includes an OLED that can emit light and a thin film transistor TFT connected to the OLED, as shown in detail in FIG. 3. Although an embodiment in which the display member DM includes the OLED and the thin film transistor TFT has been described as an exemplary embodiment for convenience of explanation, the described technology is not limited thereto. That is, in some embodiments the display member DM further includes at least one scan wiring, at least one data wiring, a plurality of thin film transistors, and at least one capacitor, which may have various known structures.

The thin film transistor TFT includes an active layer AL, a gate electrode GE, a source electrode SE, and a drain electrode DE.

The active layer AL may be formed of poly-silicon or an oxide semiconductor. The oxide semiconductor may include any one of an oxide including: titanium (Ti), hafnium (Hf), zirconium (Zr), aluminum (Al), tantalum (Ta), germanium (Ge), zinc (Zn), gallium (Ga), tin (Sn), or indium (In); and a zinc oxide (ZnO), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof.

The active layer AL includes a channel region that is not doped with impurities and a source region and a drain region that are doped with impurities and are formed at both sides of the channel region. Here, these impurities may be changed depending on the type of the thin film transistor and may be, for example, N-type or P-type impurities. When the active layer AL is formed of the oxide semiconductor, a separate protecting layer may be added in order to protect the oxide semiconductor which may be vulnerable to exposure to the external environment such as exposure to high temperatures, or the like.

The gate electrode GE is positioned above the active layer AL with one insulating layer interposed therebetween and the source electrode SE and the drain electrode DE are positioned on another insulating layer covering the gate electrode GE and are respectively connected to the source region and the drain region of the active layer AL through contact holes. The drain electrode DE is connected to a first electrode E1 of the OLED through a contact hole.

The OLED includes the first electrode E1 connected to the drain electrode DE of the thin film transistor TFT, an organic emission layer EL positioned on the first electrode E1, and a second electrode E2 positioned on the organic emission layer EL.

The first electrode E1 may be an anode, which is a hole injection electrode, and may be any one of a light reflective electrode, a light transflective electrode, and a light transmitting electrode. Meanwhile, in another exemplary embodiment, the first electrode E1 may be a cathode, which is an electron injection electrode.

The organic emission layer EL is positioned on the first electrode E1. The organic emission layer EL may be formed of a low molecular organic material or a high molecular organic material such as poly 3,4-ethylenedioxythiophene (PEDOT), or the like. The organic emission layer EL may include a red organic emission layer that can emit red light, a green organic emission layer that can emit green light, and a blue organic emission layer that can emit blue light. The red, green and blue organic emission layers are respectively formed in a red pixel, a green pixel, and a blue pixel to implement a color image. In one embodiment, the red organic emission layer, the green organic emission layer, and the blue organic emission layer are stacked as the organic emission layer EL in each of the red pixel, the green pixel, and the blue pixel and a red color filter, a green color filter, and a blue color filter are formed in each pixel, thereby making it possible to implement the color image.

As another example, a white organic emission layer that can emit white light is formed as the organic emission layer EL in each of the red pixel, the green pixel, and the blue pixel and a red color filter, a green color filter, and a blue color filter are formed in each pixel, thereby making it possible to implement the color image. When implementing the color image using the white organic emission layer, which is the organic emission layer EL, and the color filter, deposition masks for depositing the red, green and blue organic emission layers on the respective individual pixels, that is, the red pixel, the green pixel, and the blue pixel do not need to be used. The white organic emission layer, which is the organic emission layer EL described in another example, can be formed of one organic emission layer or may include a configuration in which a plurality of organic emission layers are stacked to emit white light. As an example, the organic emission layer EL may include a configuration in which at least one yellow organic emission layer and at least one blue organic emission layer are combined with each other to emit white light, a configuration in which at least one cyan organic emission layer and at least one red organic emission layer are combined with each other to emit white light, a configuration in which at least one magenta organic emission layer and at least one green organic emission layer are combined with each other to emit white light, or the like.

The second electrode E2 is positioned on the organic emission layer EL and may be a cathode, which an electron injection electrode. The second electrode E2 may be any one of a light reflective electrode, a light transflective electrode, and a light transmitting electrode. The second electrode E2 is positioned over the entirety of the display area DA of the substrate SUB so as to cover the organic emission layer EL. Meanwhile, in another exemplary embodiment, the second electrode E2 may be an anode, which is a hole injection electrode.

The encapsulation EN is positioned above the substrate SUB with the display member DM interposed therebetween. The encapsulation EN is positioned above the substrate SUB over the entirety of the display area DA and the non-display area NDA of the substrate SUB and encapsulates the display member DM together with the substrate SUB. The encapsulation EN may be formed of a thin film encapsulation layer. The encapsulation EN includes an organic layer OL positioned over the display member DM and an inorganic layer IL positioned on the organic layer OL. Meanwhile, in another exemplary embodiment, the encapsulation EN may include at least one organic layer and at least one inorganic layer that are alternately stacked. In more detail, there may be a plurality of each of the inorganic and organic layers and the inorganic and organic layers may be alternately stacked. For example, the encapsulation EN may include at least one sandwich structure in which at least one organic layer is inserted between at least two inorganic layers.

The organic layer OL may be formed of polymer, and may be, for example, a single film or a stacked film formed of any one or more of the following materials: polyethylene terephthalate, polyimide, polycarbonate, epoxy, polyethylene, and polyacrylate. For example, the organic layer may be formed of polyacrylate. In detail, the organic layer may include a polymerized monomer composition including a diacrylate based monomer and a triacrylate based monomer. Here, the monomer composition may further include a monoacrylate based monomer, and may further include the known photo initiator such as TPO, but is not limited thereto.

The inorganic layer IL may be a single film or a stacked film including a metal oxide or a metal nitride. In detail, the inorganic layer may include any one or more of SiNx, $Al_2O_3$, $SiO_2$, and $TiO_2$.

The inorganic layer IL positioned on the uppermost layer of the encapsulation EN is stacked at an area wider than that of the organic layer OL so as to cover end portions of the organic layer OL, which is another layer. In detail, the inorganic layer IL of the encapsulation EN covers the end portion of the organic layer OL in the non-display area NDA of the substrate SUB. That is, an upper inorganic layer is stacked at an area wider than that of other layers and is positioned on the uppermost layer of the encapsulation EN so as to cover end portions of other layers. Therefore, permeation of moisture into the OLED from the environment is suppressed by the inorganic layer IL.

As shown in FIGS. 2 and 3, the inorganic layer IL, which is the upper inorganic layer positioned on the uppermost layer of the encapsulation EN, includes first bridge contact holes BC1 and second bridge contact holes BC2.

The first bridge contact holes BC1 are formed at end portions of the inorganic layer IL that does not overlap the organic layer OL in the non-display area NDA of the substrate SUB and expose one end portion of each of the bridge lines BR.

The second bridge contact holes BC2 are formed at end portions of the inorganic layer IL that is not overlapped with the organic layer OL in the non-display area NDA of the substrate SUB and expose the opposite end portion of each of the bridge lines BR.

As described above, the organic layer OL is not overlapped with the bridge lines BR at the end portions of the inorganic layer IL, which is the upper inorganic layer having the first bridge contact holes BC1 and the second bridge contact holes BC2 formed therein.

The touch member TM includes first and second touch lines TL1 and TL2 positioned on the encapsulation EN so as to correspond to the display area DA of the substrate SUB and connection lines CL positioned on the encapsulation EN so as to correspond to the non-display area NDA of the substrate SUB. In some embodiments, the touch member TM is a capacitive type touch sensor and when a voltage is applied to each of the first and second touch lines TL1 and TL2 to apply electric charge to each of or between the first and second touch lines TL1 and TL2 and a touch input is applied to the touch member TM, the capacitance of the first or second touch lines TL1 or TL2 on which the touch is performed is changed, thereby enabling sensing of the position at which the touch has been applied. The touch member TM may further include at least one insulating layer covering the first and second touch lines TL1 and TL2. Each of the first touch lines TL1, the second touch lines TL2, and the connection lines CL may include one or more of the following materials: a transparent conductive material such as ITO, IZO, IGZO, etc., a metal mesh patterned in a mesh form, a conductive polymer such as poly 3,4-ethylenedioxythiophene (PEDOT), etc., a nano-sized conductive material such as a silver nano wire (AGNW), etc., and the like.

The first touch lines TL1 are positioned on the encapsulation EN so as to correspond to the display area DA of the substrate SUB and extend in a first direction. The first touch lines TL1 are directly formed on a surface of the inorganic layer IL of the encapsulation EN. A plurality of first touch lines TL1 are formed and the first touch lines TL1 are arranged in a second direction crossing the first direction and are spaced apart from each other. Here, the first and second directions may be perpendicular to each other, but are not limited thereto. That is, the first and second directions may be directions extending in various directions as long as they intersect with each other.

End portions of the first touch lines TL1 are bent and extended once or more and neighbor end portions of the second touch lines TL2. A plurality of the first touch lines TL1 are spaced apart from the remaining first touch lines TL1 in the second direction with the second touch lines TL2 interposed therebetween.

The first touch lines TL1 are extended from the display area DA of the substrate SUB to the non-display area NDA thereof and the first touch lines TL1 positioned in the non-display area NDA are connected to the bridge lines BR through the first bridge contact holes BC1 of the encapsulation EN. A plurality of first touch lines TL1 selected among the first touch lines TL1 are connected to one bridge line BR selected among a plurality of bridge lines BR. That is, a subset of the first touch lines TL1 spaced apart from each other can be electrically connected to one of the bridge lines BR.

The first touch lines TL1 can be formed using the same material as that of the second touch lines TL2 and the connection lines CL on the same layer as a layer on which the second touch lines TL2 and the connection lines CL are formed. The first touch lines TL1 can be formed on a surface of the encapsulation EN simultaneously with formation of the second touch lines TL2 and the connection lines CL via the same process as forming the second touch lines TL2 and the connection lines CL.

The second touch lines TL2 are positioned on the encapsulation EN so as to correspond to the display area DA of the substrate SUB, extend in the first direction and are spaced apart from the first touch lines TL1. The second touch lines TL2 are directly formed on the surface of the inorganic layer IL of the encapsulation EN. A plurality of second touch lines TL2 are formed and the second touch lines TL2 are arranged in the second direction between the first touch lines TL1 neighboring thereto and are spaced apart from each other.

The second touch lines TL2 include main lines ML extending in the first direction and a plurality of branch lines BL extending from the main lines ML and respectively neighboring the first touch lines TL1. End portions of the branch lines BL, which are end portions of the second touch lines TL2, are bent and extend once or more and respectively neighbor the end portions of the first touch lines TL1. That is, the end portions of the first touch lines TL1 and the end portions of the second touch lines TL2 corresponding to the display area DA of the substrate SUB are bent and extend once or more and respectively neighbor each other. The second touch lines TL2 are arranged between the first touch lines TL1 which are spaced apart from each other in the second direction.

The second touch lines TL2 extend from the display area DA of the substrate SUB to the non-display area NDA thereof and the second touch lines TL2 positioned in the non-display area NDA are electrically insulated from and intersect the bridge lines BR positioned between the encapsulation EN and the substrate SUB. The second touch lines TL2 traversing the bridge lines BR can be connected to a pad positioned at an end portion of the substrate SUB, and a flexible printed circuit board (FPCB), or the like, can be connected to the pad.

The second touch lines TL2 can be formed using the same material as that of the first touch lines TL1 and the connection lines CL on the same layer as a layer on which the first touch lines TL1 and the connection lines CL are formed. The second touch lines TL2 can be formed on the surface of the encapsulation EN simultaneously with formation of the first touch lines TL1 and the connection lines CL by the same process as forming the first touch lines TL1 and the connection lines CL.

The connection lines CL are connected to the bridge lines BR through the second bridge contact holes BC2 formed in the inorganic layer IL of the encapsulation EN so as to correspond to the non-display area NDA of the substrate SUB and extend together with the second touch lines TL2 toward the end portion of the substrate SUB. The connection lines CL extending toward the end portion of the substrate SUB can be connected to the pad positioned at the end portion of the substrate SUB, and the flexible printed circuit board (FPCB), or the like, can be connected to the pad.

A plurality of connection lines CL are formed and the connection lines CL are each electrically connected to a different bridge line BR to which the first touch lines TL1 are connected. That is, one connection line CL can be connected to one bridge line BR to which the first touch lines TL1 are connected. Therefore, the first touch lines TL1 can be connected to the pad positioned at the end portion of the substrate SUB via the bridge line BR and the connection line CL.

The connection lines CL can be formed using the same material as that of the first touch lines TL1 and the second touch lines TL2 on the same layer as a layer on which the first touch lines TL1 and the second touch lines TL2 are formed. The connection lines CL can be formed on the surface of the encapsulation EN simultaneously with formation of the first touch lines TL1 and the second touch lines TL2 by the same process as a process of forming the first touch lines TL1 and the second touch lines TL2.

The bridge lines BR are positioned between the substrate SUB and the encapsulation EN so as to correspond to the non-display area NDA of the substrate SUB. In detail, the bridge lines BR do not overlap the organic layer OL of the encapsulation EN and are positioned between the inorganic layer IL of the encapsulation EN and the substrate SUB. That is, the organic layer OL does not overlap the bridge lines BR between the bridge lines BR and the inorganic layer IL, which is an upper inorganic layer.

That is, the bridge lines BR extend in the second direction crossing the first direction. First portions of the bridge lines BR are connected to the first touch lines TL1 through the first bridge contact holes BC1 of the encapsulation EN and second portions thereof opposing the first portions are connected to the connection lines CL through the second bridge contact holes BC2 of the encapsulation EN.

A plurality of bridge lines BR are formed and the bridge lines BR are arranged in the first direction and are spaced apart from each other. The bridge lines BR electrically connect the first touch lines TL1 to the connection lines CL, respectively.

The bridge lines BR are positioned on the same layer as a layer on which the source electrode SE and the drain electrode DE of the thin film transistor TFT and include the same material as that of the source electrode SE and the drain electrode DE. The bridge lines BE can be formed on the substrate SUB simultaneously with the formation of the source electrode SE and the drain electrode DE by a process of forming the source electrode SE and the drain electrode DE.

As described above, in the display device according to an exemplary embodiment, the first touch lines TL1 of the touch member TM formed on the surface of the encapsulation EN can be electrically connected to the pad formed at the end portion of the substrate SUB through the bridge lines BR and the connection lines CL formed on the substrate SUB. The second touch lines TL2, formed on the same layer as the layer as the first touch lines TL1, are formed to include the same material as that of the first touch lines TL1 and are electrically insulated from and intersect with the bridge lines BR positioned between the encapsulation EN and the substrate SUB. The second touch lines TL2 are electrically connected to the pad formed at the end portion of the substrate SUB, such that a separate additional component for allowing the first touch lines TL1 and the second touch lines TL2 to be electrically insulated from and intersect with each other is not required on the surface of the encapsulation EN. Therefore, an additional process of forming the separate additional component for allowing the first touch lines TL1 and the second touch lines TL2 to be insulated from and intersect with each other on the surface of the encapsulation EN can be omitted. Therefore, the display device can have a decreased manufacturing time and manufacturing cost.

That is, in the display device according to an exemplary embodiment, a bridge, which is a component that enables the first touch lines TL1 and the second touch lines TL2 to be electrically insulated from and intersect each other, is not formed on the surface of the encapsulation EN, but is formed as the bridge lines BR between the substrate SUB and the encapsulation EN. Accordingly, the touch member TM including the first touch lines TL1, the second touch lines TL2, and the connection lines CL can be formed using one process. Therefore, the manufacturing time and manufacturing cost of the display device including the touch member TM can be decreased.

In addition, in the display device according to an exemplary embodiment, since the first touch lines TL1 and the second touch lines TL2 of the touch member TM do not intersect with each other in the display area DA in which the image is displayed, reflection of light on interfaces formed at portions at which the first touch lines TL1 and the second touch lines TL2 intersect with each other is fundamentally prevented. Therefore, reflection of light by an interface formed at a portion at which two touch lines intersect with each other is prevented, thereby suppressing the interface formed at the portion at which the two touch lines intersect with each other in the display area DA from being viewed to the outside. That is, the display quality of the image displayed by the display member DM is improved even though it includes the touch member TM.

Hereinafter, a display device according to another exemplary embodiment will be described with reference to FIG. 4. Hereinafter, only configurations different from those of the display device according to the embodiment of FIG. 3 will be described.

Figure 4:
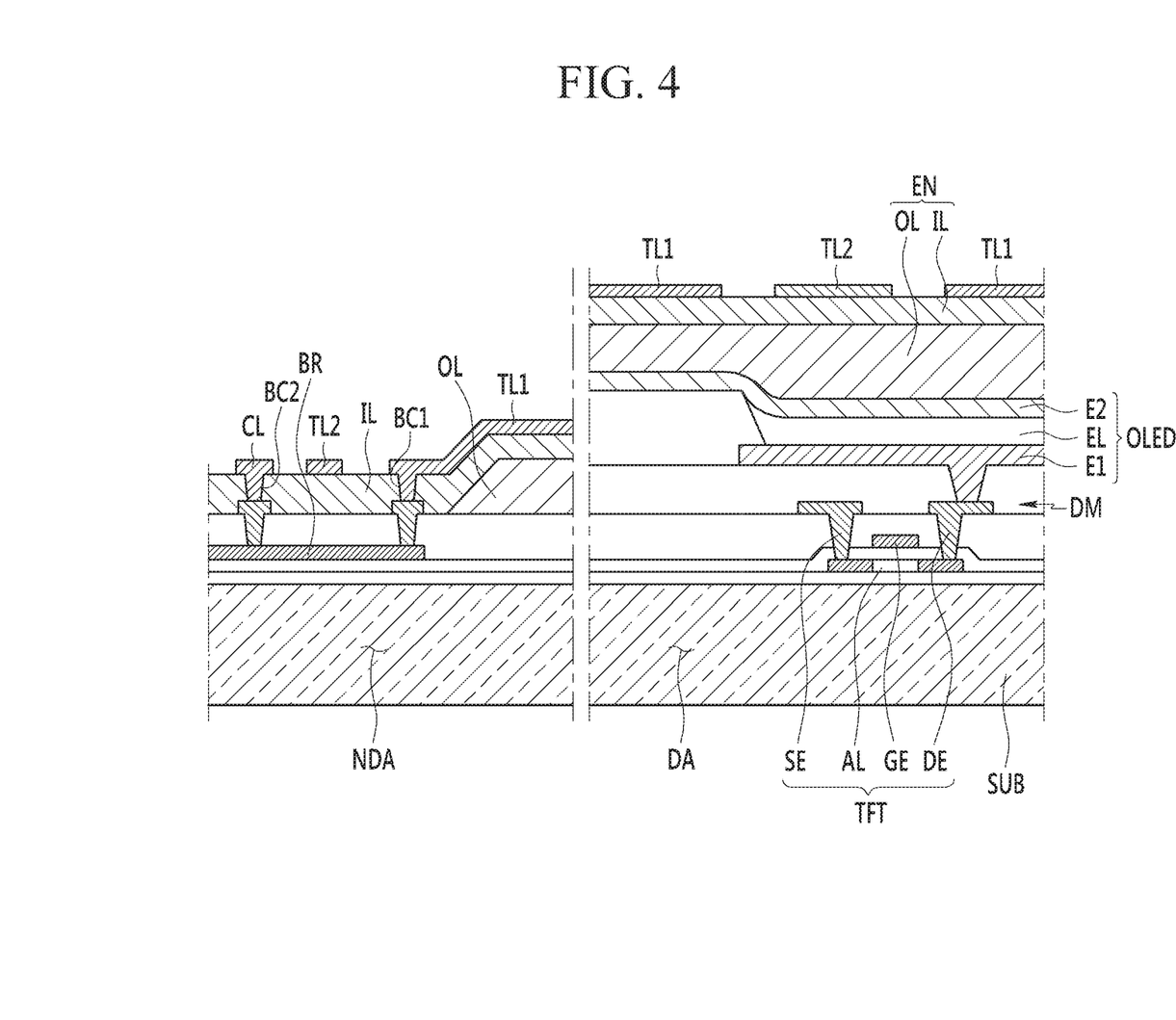
FIG. 4 is a cross-sectional view of a display device according to another exemplary embodiment.

FIG. 4 is a cross-sectional view of a display device according to another exemplary embodiment.

As shown in FIG. 4, bridge lines BR of a display device according to another exemplary embodiment can be positioned on the same layer as a layer of a gate electrode GE of a thin film transistor TFT to include the same material as that of the gate electrode GE. The bridge lines BR can be formed on a substrate SUB simultaneously with the formation of the gate electrode GE by a process of forming the gate electrode GE. The bridge lines BR can be electrically connected to first touch lines TL1 and connection lines CL through contact members formed simultaneously via a process of forming a source electrode SE and a drain electrode DE.

As described above, in the display device according to at least one exemplary embodiment, a bridge, which is a component that enables the first touch lines TL1 and the second touch lines TL2 to be electrically insulated from and intersect with each other, is not formed on the surface of the encapsulation EN, but is formed as the bridge lines BR between the substrate SUB and the encapsulation EN, such that the touch member TM including the first touch lines TL1, the second touch lines TL2, and the connection lines CL is formed using one process. Therefore, the manufacturing time and manufacturing cost of the display device including the touch member TM can be decreased.

In addition, in the display device according to at least one exemplary embodiment, since the first touch lines TL1 and the second touch lines TL2 of the touch member TM do not intersect with each other in the display area DA in which the image is displayed, reflection of light on interfaces formed at portions at which the first touch lines TL1 and the second touch lines TL2 intersect with each other is fundamentally prevented. Therefore, reflection of light by an interface formed at a portion at which two touch lines intersect with each other is prevented, thereby suppressing the interface formed at the portion at which the two touch lines intersect with each other in the display area DA from being viewed to the outside. That is, the display device in which display quality of the image displayed by the display member DM is improved even though it includes the touch member TM may be provided.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a substrate including a display area and a non-display area adjacent to the display area;
   a display member formed over the substrate in the display area;
   an encapsulation layer formed over the display member and including at least one organic layer and at least one inorganic layer;
   a plurality of first touch lines formed over the encapsulation layer in the display area, wherein the first touch lines extend in a first direction; and
   a first bridge line positioned in the non-display area,
   wherein the first bridge line extends in a second direction crossing the first direction and is electrically connected to at least one of the plurality of first touch lines,
   wherein one of the at least one inorganic layer of the encapsulation layer is formed over a wider area than the at least one organic layer of the encapsulation layer and is positioned over the at least one organic layer of the encapsulation layer so as to cover end portions of the at least one organic layer.

2. The display device of claim 1, wherein the at least one organic layer of the encapsulation layer does not have any openings exposing the bridge lines.

3. The display device of claim 1, wherein each of the plurality of first touch lines is formed directly on a surface of the encapsulation layer.

4. The display device of claim 1, wherein the plurality of first touch lines are arranged in a second direction crossing the first direction and are spaced apart from each other.

5. The display device of claim 1, wherein the first bridge line is positioned under the one of the at least one inorganic layer of the encapsulation layer.

6. The display device of claim 1, wherein:
   the one of the at least one inorganic layer of the encapsulation layer comprises a first bridge opening over the first bridge line; and
   the display device further comprises a first connection line electrically connected to the first bridge line via the first bridge opening.

7. The display device of claim 6, wherein the connection line extends toward an end portion of the substrate.

8. The display device of claim 6, further comprising:
   a second bridge line positioned in the non-display area and parallel to the first bridge line.

9. The display device of claim 8, wherein the first bridge line and the second bridge line are arranged in the first direction and are spaced apart from each other.

10. The display device of claim 9, wherein a subset of the plurality of first touch lines are electrically connected to one of the first bridge line and the second bridge line.

11. The display device of claim 10, wherein:
the one of the at least one inorganic layer of the encapsulation layer further comprises a second bridge opening over the second bridge line; and
the display device further comprises a second connection line electrically connected to the second bridge line via the second bridge opening.

12. The display device of claim 8, wherein the display member comprises:
a plurality of organic light-emitting diodes (OLEDs); and
a plurality of thin film transistors respectively electrically connected to the OLEDs.

13. The display device of claim 12, wherein:
each of the thin film transistors comprises a gate electrode; and
the first bridge line and the second bridge line are formed on a same layer as the gate electrodes and are formed of a same material as that of the gate electrodes.

14. The display device of claim 12, wherein:
each of the thin film transistors comprises source and drain electrodes; and
the first bridge line and the second bridge line are formed on a same layer as the source and drain electrodes and are formed of a same material as that of the source and drain electrodes.

15. The display device of claim 1, further comprising:
a plurality of second touch lines formed over the encapsulation layer in the display area,
wherein the plurality of second touch lines are electrically insulated from the plurality of first touch lines.

16. The display device of claim 15, wherein each of the plurality of first touch lines and the plurality of second touch lines is formed directly on a surface of the encapsulation layer.

17. The display device of claim 1, wherein the display member comprises:
a plurality of organic light-emitting diodes (OLEDs); and
a plurality of thin film transistors respectively electrically connected to the OLEDs.

18. The display device of claim 17, wherein:
each of the thin film transistors comprises a gate electrode; and
the first bridge line is formed on a same layer as the gate electrodes and is formed of a same material as that of the gate electrodes.

19. The display device of claim 17, wherein:
each of the thin film transistors comprises source and drain electrodes; and
the first bridge line is formed on a same layer as the source and drain electrodes and is formed of a same material as that of the source and drain electrodes.

20. The display device of claim 1, wherein the first bridge line is electrically connected to the plurality of first touch lines.

* * * * *